United States Patent
Wunderlich et al.

(10) Patent No.: US 11,067,626 B2
(45) Date of Patent: Jul. 20, 2021

(54) CIRCUIT ARRANGEMENT COMPRISING A MICROPROCESSOR AND A VOLTAGE GENERATING CIRCUIT

(71) Applicant: Vitesco Technologies GMBH, Hannover (DE)

(72) Inventors: Andreas Wunderlich, Wenzenbach (DE); Alfons Fisch, Falkenstein (DE); Bernhard Bieg, Regensburg (DE)

(73) Assignee: Vitesco Technologies GmbH, Hannover (DE)

(*) Notice: Subject to any disclaimer, the term of this patent is extended or adjusted under 35 U.S.C. 154(b) by 0 days.

(21) Appl. No.: 16/846,699

(22) Filed: Apr. 13, 2020

(65) Prior Publication Data

US 2021/0011081 A1 Jan. 14, 2021

Related U.S. Application Data

(63) Continuation of application No. PCT/EP2018/076456, filed on Sep. 28, 2018.

(30) Foreign Application Priority Data

Oct. 13, 2017 (DE) .................... 10 2017 218 336

(51) Int. Cl.
- G01R 31/3167 (2006.01)
- H03M 1/10 (2006.01)
- H03M 1/12 (2006.01)

(52) U.S. Cl.
CPC ........ G01R 31/3167 (2013.01); H03M 1/108 (2013.01); H03M 1/121 (2013.01)

(58) Field of Classification Search
CPC ...... H03M 1/108; H03M 1/211; H03M 1/122; H03M 1/1076; G01R 21/3167
(Continued)

(56) References Cited

U.S. PATENT DOCUMENTS

| 6,256,569 B1 | 7/2001 | Kobayashi |
| 9,281,808 B2* | 3/2016 | Steedman .............. G06F 1/3243 |

(Continued)

FOREIGN PATENT DOCUMENTS

| DE | 19847667 A1 | 4/1999 |
| DE | 102010001563 A1 | 8/2010 |

(Continued)

OTHER PUBLICATIONS

International Search Report and Written Opinion dated Jan. 15, 2019 from corresponding International Patent Application No. PCT/EP2018/076456.

(Continued)

*Primary Examiner* — Lam T Mai

(57) ABSTRACT

A circuit arrangement includes a microcontroller having a first analog-to-digital converter whose input is connected to the output of a first multiplexer whose output is connected to a first comparison device for comparing reference voltages, and a first serial interface circuit connected to the first comparison device. A voltage generating circuit includes a second analog-to-digital converter whose input is connected to the output of a second multiplexer whose output is connected to a number of registers, which are connected to a safety value generator and store digital values together with a respective safety value, and a second serial interface circuit connected to the registers. The first and second serial interface circuits are connected to each other for communication of the microcontroller with the voltage generating circuit, the first interface circuit being connected to a second comparison device for comparing supply voltages and/or currents with desired voltages and/or desired currents.

10 Claims, 2 Drawing Sheets

(58) Field of Classification Search
USPC .................................................. 341/130–160
See application file for complete search history.

(56) References Cited

U.S. PATENT DOCUMENTS

| | | |
|---|---|---|
| 9,566,920 B2 * | 2/2017 | Melzl .................. G06F 11/0751 |
| 2010/0287398 A1 | 11/2010 | Froschhammer et al. |
| 2011/0110129 A1 * | 5/2011 | Busch .................. H02M 7/162 |
| | | 363/53 |
| 2012/0079218 A1 | 3/2012 | Schriefer et al. |
| 2012/0206282 A1 | 8/2012 | Gorbold |
| 2013/0151175 A1 | 6/2013 | Streit |
| 2015/0102950 A1 | 4/2015 | Karner |
| 2018/0287398 A1 | 10/2018 | Melack et al. |

FOREIGN PATENT DOCUMENTS

| | | |
|---|---|---|
| DE | 102007045509 A1 | 6/2011 |
| DE | 102012203670 A1 | 9/2013 |
| JP | 2012186873 A | 9/2012 |

OTHER PUBLICATIONS

German Office Action dated May 17, 2018 for corresponding German Patent Application No. 10 2017 218 336.5.

* cited by examiner

CIRCUIT ARRANGEMENT COMPRISING A MICROPROCESSOR AND A VOLTAGE GENERATING CIRCUIT

CROSS REFERENCE TO RELATED APPLICATIONS

This application claims the benefit of PCT Application PCT/EP2018/076456, filed Sep. 28, 2018, which claims priority to German Application DE 10 2017 218 336.5, filed Oct. 13, 2017. The disclosures of the above applications are incorporated herein by reference.

BACKGROUND

Control units for controlling a wide range of functions in a motor vehicle, such as engine control units, transmission control units or air-bag control units, have a large number of electrical and electronic components, an essential component of which is a microcontroller which, among other things, processes sensor signals in order to be able to provide control signals for actuators.

Since many sensor signals are in analog form, the microcontrollers used in such control units have analog-to-digital converters in order to have the sensor signals available in digital form for further processing. In order to be able to convert a larger number of analog input signals into digital values without the need for a corresponding number of analog-to-digital converters, an analog-to-digital converter is usually preceded by a multiplexer to whose inputs the analog signals are applied.

In order to be able to supply the microcontroller and other electronic components such as ASICs with corresponding voltages, wherein today's integrated circuits often require several supply voltages in the range of approximately 1.3 volts to 5 volts, the aforementioned control units have a voltage generating circuit which generates the required supply voltages from a DC voltage generated by a DC/DC converter from the vehicle battery and makes them available in a regulated manner at appropriate outputs.

FIG. 1 shows a combination of such a microcontroller MC and such a voltage generating circuit VGC, as implemented in engine control units of the applicant. In order to be able to check that the analog-to-digital converter ADC1 of the microcontroller MC is functioning correctly, the voltage generating circuit VGC also has an analog-to-digital converter ADC2. Both analog-to-digital converters ADC1, ADC2—that of the voltage generating circuit VGC directly and that of the microcontroller MC via the multiplexer MUX1 assigned to it—are supplied with a DC voltage signal V Ref at their inputs and the digital conversion results are compared with each other in the microcontroller MC by means of a first comparison device CD1. The comparison result indicates whether the two analog-to-digital converters ADC1, ADC2 provide the same result and thus function properly or not. The conversion result of the analog-to-digital converter ADC2 of the voltage generating circuit VGC is transmitted to the microcontroller MC via SPI interfaces SPI1, SPI2 available in both devices.

The voltage generating circuit VGC in the version shown in FIG. 1 provides output voltages V_out1, V_out2 to V_outx, which lead to corresponding currents I_out1 to I_outx. An input voltage V in is applied to the input of the voltage supply circuit VGC, which can be obtained from the battery voltage of the motor vehicle battery by a switching regulator, for example.

There are requirements to check these voltages for compliance with a certain voltage value. If this is to be done in the microcontroller, the voltages and currents to be checked must be fed to the analog-to-digital converter ADC1 of the microcontroller MC, which, as shown in FIG. 1, must be done via the multiplexer MUX1. However, this means that a large number of inputs of this multiplexer MUX1 are occupied and these inputs are then no longer available for other analog signals. In addition, these voltages and currents must be fed to the multiplexer inputs via suitable filter circuits, which requires a corresponding amount of circuitry.

SUMMARY

Accordingly, a circuit arrangement according to the example embodiment includes a microcontroller and a voltage generating circuit, the microcontroller including a first analog-to-digital converter whose input is connected to the output of a first multiplexer having n inputs and whose output is connected to a first comparison device for comparing reference voltages, and a first serial interface circuit connected to the first comparison device, and the voltage generating circuit including a second analog-to-digital converter whose input is connected to the output of a second multiplexer having k inputs and whose output is connected to a number k of registers, which are connected to a safety value generator and are designed to store digital values together with a respective safety value, and a second serial interface circuit connected to the k registers. The first and second serial interface circuits are thereby connected to each other for communication of the microcontroller with the voltage generating circuit, the first interface circuit being connected to a second comparison device for comparing supply voltages and/or supply currents with desired voltages and/or desired currents.

Thus, digital data converted by the second analog-to-digital converter may be stored in one of the k registers and provided with a safety value of the safety value generator in the voltage generating circuit. They may then be transferred to the microcontroller via the serial interface and compared there with setpoints or setpoint ranges. This frees analog input pins on the microcontroller for other analog signals. The safety value, which may be a simple time stamp or message counter value in a design of the circuit arrangement according to the example embodiment, but also a value for a cyclic redundancy check (CRC), may be used to check whether current converted values are present and are compared, but also safety-relevant values may be converted and compared in this way.

In a beneficial design of the circuit arrangement, the voltage generating circuit is designed as an integrated circuit and output ports for providing supply voltages are connected to inputs of the second multiplexer within the integrated circuit.

Instead of applying the supply voltages generated by the voltage generating circuit and to be checked to the analog inputs of the microcontroller, which would block them for other tasks, these supply voltages and, if necessary, currents flowing as a result of them are applied directly to the inputs of the second multiplexer within the voltage generating circuit designed as an ASIC in accordance with the example embodiment, thus being able to save connection pins on the integrated circuit or the microcontroller. Nevertheless, a check takes place in the microcontroller by serially transmitting the digital data to it and comparing them there with setpoints. In a beneficial way, this digital data may be secured by the safety value, so that this procedure may also be applied to safety-relevant data.

BRIEF DESCRIPTION OF THE DRAWINGS

The invention shall be described in more detail in the following by means of an example embodiment with the aid of a figure. In the drawings.

DETAILED DESCRIPTION

Figure 1:
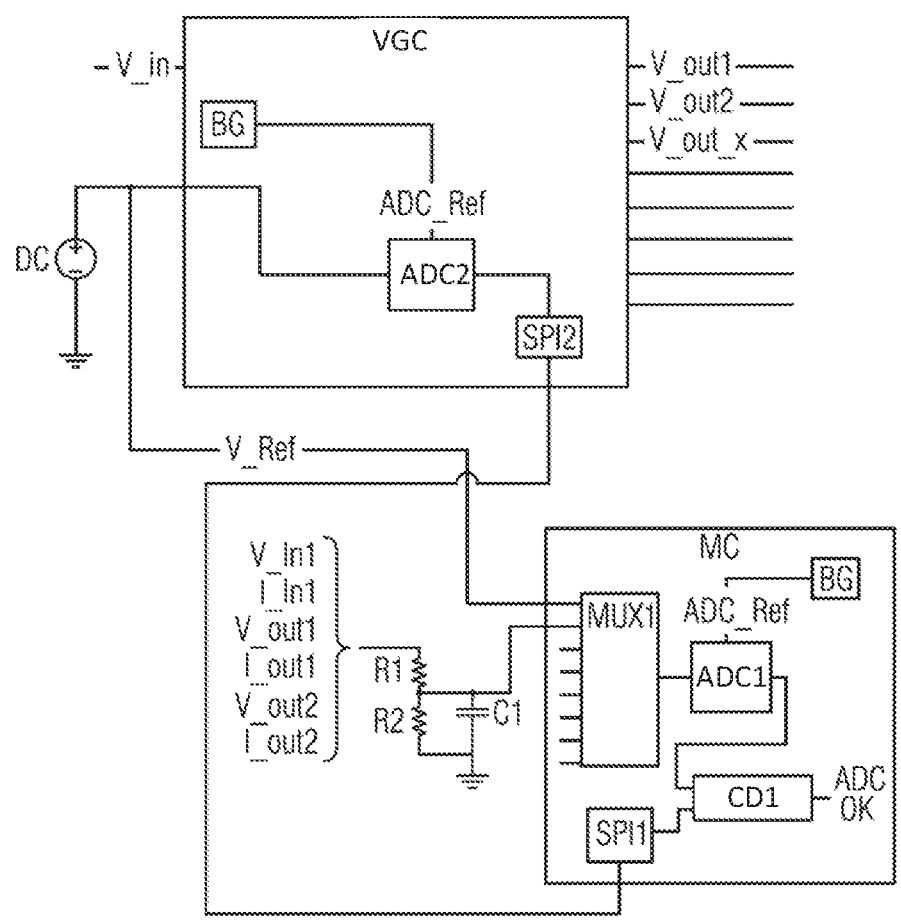
FIG. 1 shows a circuit arrangement with a microcontroller and a voltage generating circuit according to the prior art.
Figure 2:
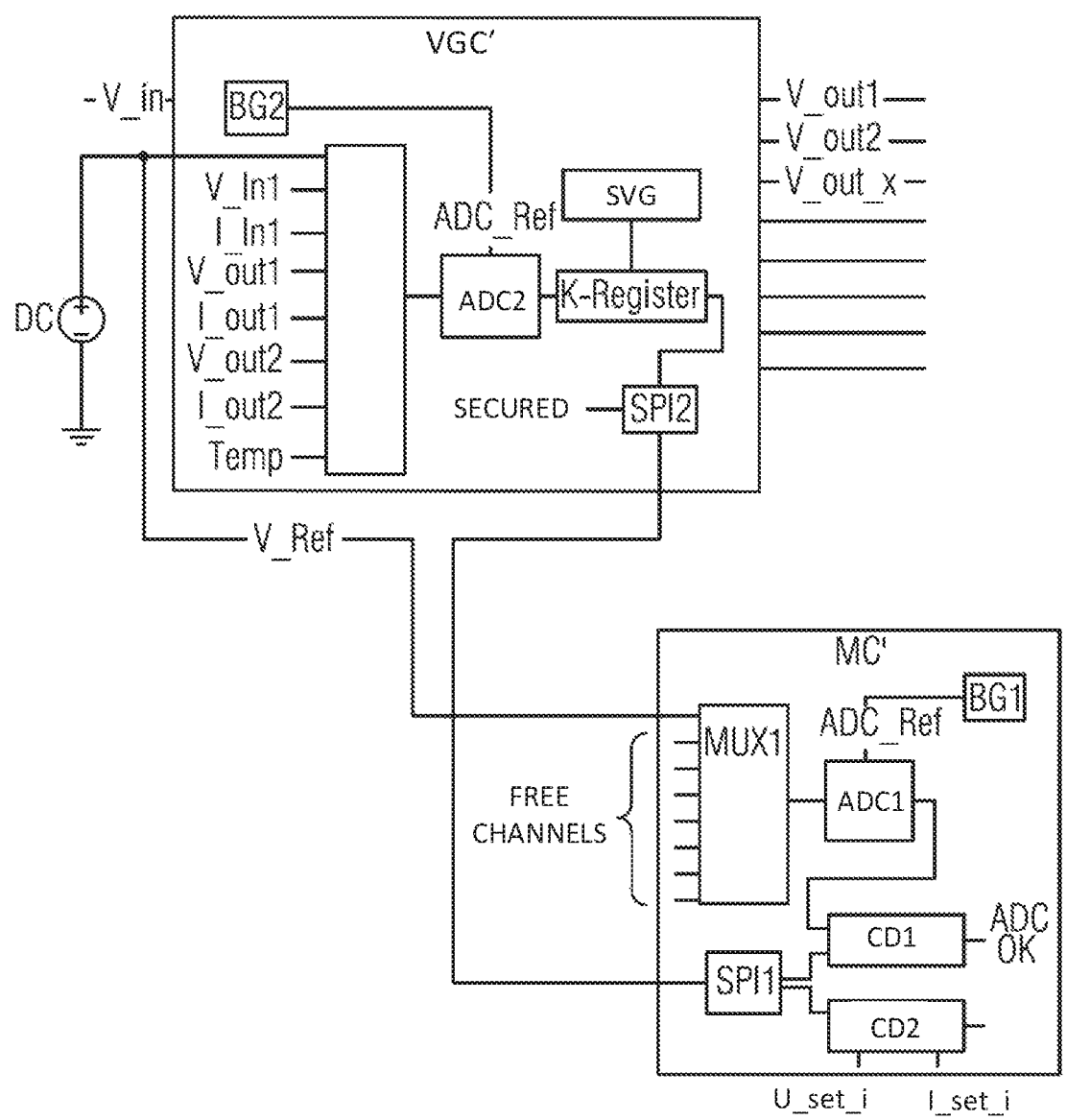
FIG. 2 shows a circuit arrangement in accordance with the example embodiment.

The circuit arrangement in the example embodiment according to FIG. 2 has, in the same way as the known circuit arrangement, a microcontroller MC' containing a first analog-to-digital converter ADC1, whose input or one of possibly several inputs is connected to the output of a first multiplexer MUX1. The inputs of the first multiplexer MUX1 are connected to input ports of the microcontroller MC' and may be fed with any analog signals—for example sensor signals.

The first analog-to-digital converter ADC1 is connected to a bandgap reference voltage source BG1. The output of the first analog-to-digital converter ADC1 is connected to a first input of a first comparison device CD1, whose second input is connected to a first serial interface SPI1. Any other serial interface may also be used instead of an SPI interface. A signal representing the comparison result is provided at the output of the first comparison device CD1.

The microcontroller MC' has a second comparison device CD2, one input of which is also connected to the first serial interface SPI1. Further inputs are provided with setpoints for voltage and/or current values U set i, I set i to be checked. The comparison devices CD1, CD2 may be implemented as programs or hard-wired in the microcontroller MC'.

The circuit arrangement in the example embodiment according to FIG. 2 also has a voltage generating circuit VGC', which is designed as an integrated circuit and has a second serial interface SPI2, which is connected to the first serial interface SPI1 of the microcontroller MC'. This serial link is used for communication between the microcontroller MC' and the voltage generating circuit VGC', which also includes data transmission.

The voltage generating circuit VGC' has a second analog-to-digital converter ADC2 connected to a second bandgap reference voltage BG2. The input port of second analog-to-digital converter ADC2 is connected to the output of a second multiplexer MUX2, which has a number of k input ports. The output of the second analog-to-digital converter ADC2 is connected to a number k of registers REG1 to REGk, which are connected to the second serial interface SPI2 and to a safety value generator SVG.

The voltage generating circuit VGC' has at least one input port for receiving an input voltage V in, from which output voltages V_out1, V_out2 to V_out_x are generated and provided as regulated voltages at output ports for other circuits, for example for the microcontroller MC'.

Another input port is connected to one of the input ports of the second multiplexer MUX2. A DC voltage may be applied to this and to an input port of the first multiplexer MUX1 of the microcontroller MC'. This is converted from analog-to-digital in both the voltage generating circuit VGC' and the microcontroller MC' and the value converted in the voltage generating circuit VGC' is transmitted by means of the SPI communication interface SPI1, SPI2 from the voltage generating circuit VGC' to the microcontroller MC', where the two converted values are compared with each other in the first comparison device CD1. At the output of the first comparison device CD1 it is indicated whether the values match and consequently whether the analog-to-digital converters ADC1, ADC2 function correctly.

According to the example embodiment, the output voltages V_out1, V_out2 to V_out_x generated in the voltage generating circuit VGC' and, if applicable, the currents I_out1, I_out2 to I_out_x generated by them, as well as the input voltage V in and the input current I in within the voltage generating circuit VGC', are directly applied to the inputs of the second multiplexer MUX2 and are stored after their analog-digital conversion in respective registers REG1 to REGk, if necessary together with a safety value. They may be transmitted from there via the serial communication interface SPI1, SPI2 to the microcontroller MC', where they are compared in the second comparison device CD2 with voltage and current setpoints U set i, I set i with i=1 to k. This may be used to check whether the output voltages and output currents V_out1, V_out2 to V_out, I_out1, I_out2 to I_out_x and the input voltage U in and the input current I in and, if necessary, other values such as the temperature Temp are within a specified range.

The safety values may be simple time stamps or values of a message counter in order to be able to check whether the transmitted digital values are current values, but for safety-critical values they may also be, for example, the results of a cyclic redundancy check (CRC).

The circuit arrangement offers high flexibility, as the second multiplexer may convert numerous analog parameters externally to the microcontroller MC'. The benefit lies in the saving of several microcontroller analog input pins and their input circuitry for signal conditioning such as voltage dividers and a filter structure. There are also layout benefits and improved signal integrity. By integrating the functions in the voltage generating circuit, lower tolerances are possible, e.g. for voltage/current measurement.

The example embodiment has been described herein in an illustrative manner, and it is to be understood that the terminology which has been used is intended to be in the nature of words of description rather than of limitation. Obviously, many modifications and variations of the invention are possible in light of the above teachings. The description above is merely exemplary in nature and, thus, variations may be made thereto without departing from the spirit and scope of the invention as defined in the appended claims.

The invention claimed is:

1. A circuit arrangement, comprising:
   a microcontroller comprising
      a first multiplexer,
      a first analog-to-digital converter whose input is connected to an output of the first multiplexer, the first multiplexer having a plurality of inputs,
      a first comparison device having an input connected to an output of the first analog-to-digital converter, the first comparison device comparing reference voltages,
      a second comparison device, and
      a first serial interface circuit connected to the first comparison device, and
   a voltage generating circuit comprising
      a second multiplexer having a plurality of inputs, a second analog-to-digital converter whose input is connected to an output of the second multiplexer having a plurality of inputs, a plurality of registers, the second multiplexer having an output connected to the registers, a safety value generator connected to the registers, the registers configured to store digital values together with a respective safety value generated by the safety value generator, and a second serial interface circuit connected to the registers, wherein the first and second serial interface circuits are connected to each other for communication of the microcontroller with the voltage generating circuit, and wherein the first interface circuit is connected to the second comparison device for comparing at least one of
a plurality of supply voltages with one or more predetermined voltages, and
a plurality of supply currents with one or more predetermined currents.

2. The circuit arrangement as claimed in claim 1, wherein the voltage generating circuit is configured as an integrated circuit with output ports providing the plurality of supply voltages to inputs of the second multiplexer within the integrated circuit.

3. The circuit arrangement as claimed in claim 1, wherein the safety value generator is configured to generate a time stamp.

4. The circuit arrangement as claimed in claim 1, wherein the safety value generator includes a message counter.

5. The circuit arrangement as claimed in claim 1, wherein the safety value generator is configured to generate values of a cyclic redundancy test.

6. A circuit arrangement, comprising:
a microcontroller comprising
a first multiplexer,
a first analog-to-digital converter whose input is connected to an output of the first multiplexer, the first multiplexer having a plurality of inputs,
a first comparator device having an input connected to an output of the first analog-to-digital converter, the first comparator device comparing reference voltages,
a second comparator device, and
a first serial interface circuit connected to the first comparator device, and
a voltage generating circuit comprising
a second multiplexer having a plurality of inputs,
a second analog-to-digital converter whose input is connected to an output of the second multiplexer,
a plurality of registers, the second multiplexer having an output connected to an input of the registers,
a safety value generator connected to the registers, the registers storing digital values together with a respective safety value generated by the safety value generator, and
a second serial interface circuit having an input connected to the registers,
wherein the first and second serial interface circuits are connected to each other for communication of the microcontroller with the voltage generating circuit, and
wherein the first interface circuit is connected to the second comparator device, the second comparator device comparing at least one of
a plurality of supply voltages with one or more predetermined voltages, and
a plurality of supply currents with one or more predetermined currents.

7. The circuit arrangement as claimed in claim 6, wherein the voltage generating circuit comprises an integrated circuit with output ports providing the plurality of supply voltages to inputs of the second multiplexer within the integrated circuit.

8. The circuit arrangement as claimed in claim 6, wherein the safety value generator generates a time stamp, the safety value comprising the time stamp.

9. The circuit arrangement as claimed in claim 6, wherein the safety value generator includes a message counter, an output of the message counter comprising the safety value.

10. The circuit arrangement as claimed in claim 6, wherein the safety value generator generates values of a cyclic redundancy test, the safety value comprising a value for a cyclic redundancy check.

* * * * *